United States Patent
Ahn et al.

(10) Patent No.: US 11,916,026 B2
(45) Date of Patent: Feb. 27, 2024

(54) HIGH VOLTAGE SUPPLY CLAMP

(71) Applicant: QUALCOMM Incorporated, San Diego, CA (US)

(72) Inventors: Jongshick Ahn, San Diego, CA (US); Iulian Mirea, San Diego, CA (US); Chung-Ti Hsu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 149 days.

(21) Appl. No.: 16/535,012

(22) Filed: Aug. 7, 2019

(65) Prior Publication Data

US 2020/0058603 A1 Feb. 20, 2020

Related U.S. Application Data

(60) Provisional application No. 62/719,032, filed on Aug. 16, 2018.

(51) Int. Cl.
*H01L 23/64* (2006.01)

(52) U.S. Cl.
CPC ................ *H01L 23/642* (2013.01)

(58) Field of Classification Search
CPC ......... H03K 17/02; H03K 17/687–689; H03K 17/6872; H03K 19/0175–0179; H03F 3/26; H02M 3/07; H02M 3/158; H02M 3/06–07; H02M 1/08; H02M 7/217; H02M 7/537; H01L 23/642; H01L 27/0285
USPC .............. 361/50–59, 90, 91.1, 101
See application file for complete search history.

(56) References Cited

U.S. PATENT DOCUMENTS

| | | | |
|---|---|---|---|
| 7,072,161 B2* | 7/2006 | Chen | H01L 27/0266 361/56 |
| 7,782,580 B2* | 8/2010 | Gauthier, Jr. | H01L 27/0285 361/56 |
| 8,072,722 B1* | 12/2011 | Hwang | H02H 9/046 361/56 |
| 8,514,532 B2 | 8/2013 | Worley et al. | |
| 8,913,359 B2 | 12/2014 | Lai et al. | |
| 9,640,988 B2 | 5/2017 | Ellis-Monaghan et al. | |
| 9,893,517 B2 | 2/2018 | Dey et al. | |
| 10,116,297 B1* | 10/2018 | Wu | H03K 19/017509 |
| 10,826,291 B2 | 11/2020 | Xavier | |
| 2006/0072267 A1* | 4/2006 | Chatty | H03K 17/08142 361/91.1 |
| 2008/0013233 A1 | 1/2008 | Otake et al. | |
| 2010/0148797 A1* | 6/2010 | Ker | H02H 9/046 324/555 |
| 2010/0246076 A1* | 9/2010 | Campi, Jr. | G06F 30/30 361/56 |
| 2012/0176710 A1* | 7/2012 | Domanski | H02H 9/046 257/300 |
| 2012/0188016 A1* | 7/2012 | Hunt | H03F 1/308 330/269 |

(Continued)

*Primary Examiner* — Tuan T Dinh
(74) *Attorney, Agent, or Firm* — Loza & Loza, LLP

(57) ABSTRACT

In certain aspects, a clamp includes first and second transistors coupled in series between a power bus and a ground. The clamp also includes a resistive voltage divider configured to bias a gate of the first transistor and a gate of the second transistor based on a supply voltage on the power bus. The clamp further includes a capacitive voltage divider configured to turn on the first and second transistors in response to a voltage transient on the power bus exceeding a trigger threshold voltage.

35 Claims, 6 Drawing Sheets

(56) References Cited

U.S. PATENT DOCUMENTS

| | | | |
|---|---|---|---|
| 2013/0084799 A1* | 4/2013 | Marholev | H03F 3/45179 |
| | | | 455/41.1 |
| 2013/0229736 A1* | 9/2013 | Van Der Borght | H02H 9/044 |
| | | | 361/56 |
| 2013/0335870 A1 | 12/2013 | Kushibe et al. | |
| 2014/0084962 A1* | 3/2014 | Schuler | H03K 19/00 |
| | | | 327/108 |
| 2015/0070806 A1* | 3/2015 | Parthasarathy | H02H 9/04 |
| | | | 361/57 |
| 2015/0229126 A1* | 8/2015 | Domanski | H02H 9/046 |
| | | | 361/56 |
| 2015/0288173 A1* | 10/2015 | Chen | H01L 27/0248 |
| | | | 361/56 |
| 2016/0307886 A1* | 10/2016 | Roberts | H01L 27/0248 |
| 2016/0372466 A1* | 12/2016 | Weis | H01L 29/7838 |
| 2017/0264288 A1* | 9/2017 | Wu | H03K 17/6872 |
| 2017/0324385 A1* | 11/2017 | Mckay | H01L 21/67011 |
| 2017/0366083 A1* | 12/2017 | Emsenhuber | H02M 1/08 |
| 2019/0115829 A1 | 4/2019 | Oporta et al. | |
| 2019/0140635 A1* | 5/2019 | Abesingha | H03K 17/0822 |
| 2021/0083572 A1 | 3/2021 | Yen et al. | |
| 2023/0148160 A1 | 5/2023 | Sivakumar et al. | |

\* cited by examiner

700

Bias a gate of a first transistor and a gate of a second transistor based on a supply voltage on a power bus, wherein the first transistor and the second transistor are coupled in series between the power bus and a ground ⸺ 710

Turn on the first and second transistors in response to a voltage transient on the power bus exceeding a trigger threshold voltage ⸺ 720

FIG. 7

HIGH VOLTAGE SUPPLY CLAMP

RELATED APPLICATION

This application claims priority under 35 U.S.C. § 119(e) to U.S. Provisional Application No. 62/719,032 filed on Aug. 16, 2018, the entire specification of which is incorporated herein by reference.

BACKGROUND

Field

Aspects of the present disclosure relate generally to protection circuits, and more particularly, to high voltage supply clamps.

Background

An integrated circuit is susceptible to damage from electrostatic discharge (ESD) as well as high voltage spikes on a supply voltage. An ESD event may occur due to transfer of charge from an object or a person to the integrated circuit (e.g., during handling of the integrated circuit). To protect the integrated circuit against ESD and high voltage spikes, a high voltage clamp may be coupled in parallel with the integrated circuit. During normal operating conditions, the high voltage clamp has a high impedance so that the clamp does not affect normal operation of the integration circuit. When an ESD event or a high voltage spike occurs, the voltage clamp is triggered, causing the high voltage clamp to provide a low-impedance path to ground. The low-impedance path shunts the energy of the ESD or high voltage spike away from the integrated circuit, thereby protecting the integrated circuit.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a clamp. The clamp includes first and second transistors coupled in series between a power bus and a ground. The clamp also includes a resistive voltage divider configured to bias a gate of the first transistor and a gate of the second transistor based on a supply voltage on the power bus. The clamp further includes a capacitive voltage divider configured to turn on the first and second transistors in response to a voltage transient on the power bus exceeding a trigger threshold voltage.

A second aspect relates to a circuit protection method. The method includes biasing a gate of a first transistor and a gate of a second transistor based on a supply voltage on a power bus, wherein the first transistor and the second transistor are coupled in series between the power bus and a ground. The method also includes turning on the first and second transistors in response to a voltage transient on the power bus exceeding a trigger threshold voltage.

A third aspect relates to an apparatus for circuit protection. The apparatus includes first and second transistors coupled in series between a power bus and a ground. The apparatus also comprises means for biasing a gate of the first transistor and a gate of the second transistor based on a supply voltage on the power bus, and means for turning on the first and second transistors in response to a voltage transient on the power bus exceeding a trigger threshold voltage.

BRIEF DESCRIPTION OF THE DRAWINGS

FIG. 7 is a flowchart illustrating a circuit protection method according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
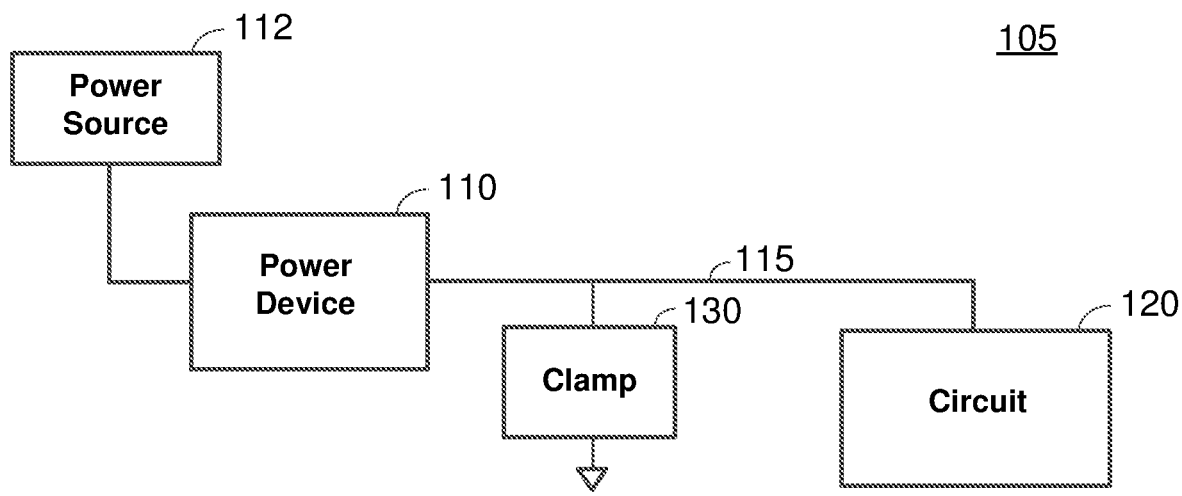
FIG. 1 shows an example of a high voltage clamp coupled to a power bus according to certain aspects of the present disclosure.

FIG. 1 shows an example of a system 105 including a circuit 120, a power device 110, and a power bus 115 coupled between the circuit 120 and the power device 110. The power device 110 (e.g., power management integrated circuit) generates a supply voltage that is supplied to the circuit 120 via the power bus 115 to power the circuit 120. The power device 110 may include one or more switching voltage regulators (e.g., buck converter and/or boost converter) that convert a voltage from a power source 112 (e.g., a battery) into the supply voltage. The power device 110 and the circuit 120 may be located on separate chips or integrated on the same chip.

During operation, a high voltage transient may appear on the power bus 115 due to a switching transient in the power device 110 and/or another device (not shown) coupled to the power bus 115. A high voltage transient may also occur during an ESD event due to the transfer of charge from an object or person to the power bus 115. The high voltage transient can damage the circuit 120 if the high voltage transient exceeds the maximum voltage that can be tolerated by the circuit 120.

To protect the circuit 120 against high voltage transients, a high voltage clamp 130 may be coupled to the power bus 115. During normal operating conditions, the high voltage clamp 130 has a high impedance so that the clamp does not affect the supply voltage on the power bus 115. When a high voltage transient appears on the power bus 115, the high voltage clamp 130 is triggered, causing the high voltage clamp 130 to provide a low-impedance path from the power bus 115 to ground. As a result, the clamp 130 shunts the energy of the high voltage transient to ground, which significantly reduces the maximum voltage that reaches the circuit 120. Thus, the high voltage clamp 130 suppresses high voltage transients on the power bus 115 to protect the circuit 120.

A clamp may also be coupled between the power source 112 and the power device 110 to protect the power device 110 from high voltage transients. In general, it is to be appreciated that a clamp may be placed anywhere on the system 105 depending on where protection from high voltage transients is needed in the system 105.

Figure 2:
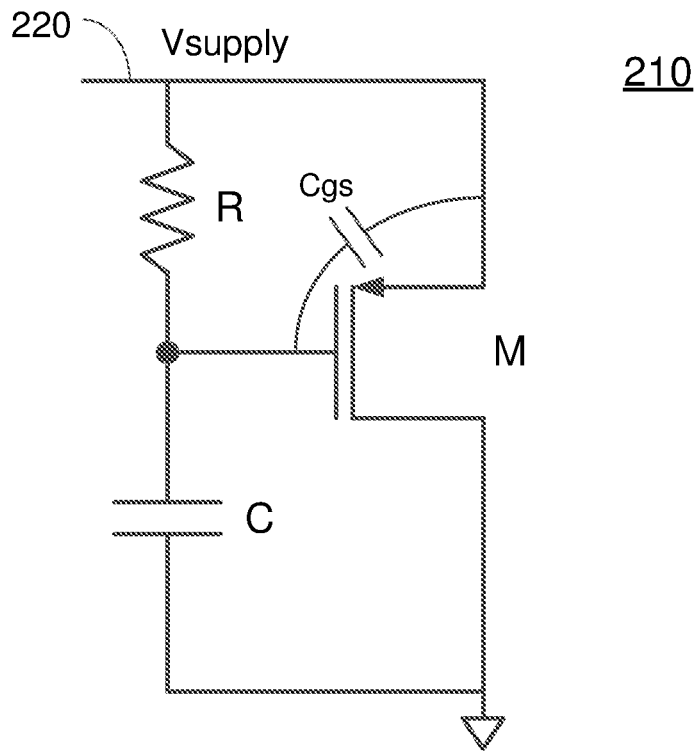
FIG. 2 shows an example of a high voltage clamp including a single transistor according to certain aspects of the present disclosure.

FIG. 2 shows an example of a high voltage clamp 210 according to certain aspects of the present disclosure. The high voltage clamp 210 may be used to implement the high voltage clamp 130 shown in FIG. 1. In this example, the high voltage clamp 210 includes a p-type transistor M. The transistor M may be implemented with a laterally diffused metal oxide semiconductor (LDMOS) transistor. The source of the transistor M is coupled to a power bus 220 (e.g., power bus 115) and the drain of the transistor M is coupled to ground. As a result, when the transistor M is turned on, the transistor M provides a low-impedance path from the power bus 220 to ground through the transistor M.

The high voltage clamp 210 also includes a resistor R coupled between the source and the gate of the transistor M, and a capacitor C coupled between the gate of the transistor M and ground. The capacitor C and the gate-to-source capacitance Cgs of the transistor M form a capacitive voltage divider, as discussed further below. In FIG. 2, the gate-to-source capacitance Cgs of the transistor M is depicted as a capacitor coupled between the source and the gate of the transistor M for illustrative purposes. However, it is to be appreciated that the gate-to-source capacitance Cgs comes from the structure of the transistor M.

During normal operation, the power bus 220 may provide a supply voltage (labeled "Vsupply") to the circuit 120, in which the supply voltage is a DC voltage. Thus, during normal operation, the high voltage clamp 210 operates under DC voltage conditions. Under DC voltage conditions, the resistor R between the source and the gate of the transistor M causes the gate-to-source voltage of the transistor M to be approximately zero volts. As a result, the transistor M is turned off. Since the transistor M is turned off, the transistor M has a high impedance, and therefore does not affect the supply voltage on the power bus 220.

When a high voltage transient is present on the power bus 220, the capacitive voltage divider formed by the capacitor C and the gate-to-source capacitance Cgs of the transistor M divides the high voltage transient into a transient voltage between the source and the gate of the transistor M and a transient voltage between the gate of the transistor M and ground. This assumes that the resistor R does not respond to the high voltage transient (i.e., the duration of the high voltage transient is shorter than an RC time constant associated with the resistor R). When the transient voltage between the source and the gate of the transistor M reaches the threshold voltage of the transistor M, the transistor M turns on and provides a low-impedance path from the power bus 220 to ground through the transistor M. As a result, the energy of the high voltage transient is shunted to ground, which suppresses the high voltage transient and reduces the maximum voltage that reaches the circuit 120.

In this example, the high voltage clamp 210 is triggered (i.e., the transistor M turn on) when the high voltage transient exceeds a trigger voltage threshold. The trigger voltage threshold is a function of the gate-to-source capacitance Cgs of the transistor M and the capacitance of the capacitor C that form the capacitive voltage divider of the clamp 210. Thus, the trigger voltage threshold of the high voltage clamp 210 may be set to a desired voltage by sizing the capacitance of the capacitor C accordingly. The trigger voltage threshold may be set to, e.g., one to three volts above the supply voltage. Thus, in this example, the high voltage clamp 210 is triggered when a high voltage transient exceeds the trigger voltage threshold of the high voltage clamp 210, which is set by the capacitive voltage divider of the clamp 210.

As discussed above, the transistor M may be implemented with an LDMOS transistor. An advantage of using an LDMOS transistor is that an LDMOS transistor typically has a higher drain-to-source voltage limit (i.e., can tolerate a higher maximum drain-to-source voltage) than a non-LDMOS transistor. In the past, the higher drain-to-source voltage limit of the LDMOS transistor has allowed the use of a single transistor in the high voltage clamp 210. However, as semiconductor processes scale down, the drain-to-source voltage limits of LDMOS transistors have decreased. As a result, the voltage on the power bus may exceed the drain-to-source voltage limit of an LDMOS transistor for newer processes, making the high voltage clamp 210 shown in FIG. 2 unsuitable.

To address this, aspects of the present disclosure provide a high voltage clamp with stacked transistors instead of a single transistor. In these aspects, the voltage on the power bus is divided (split) among the stacked transistors. As a result, the voltage across each transistor is reduced. This allows the high voltage clamp to be implemented using transistors with lower drain-to-source voltage limits compared with the high voltage clamp shown in FIG. 2.

Figure 3:
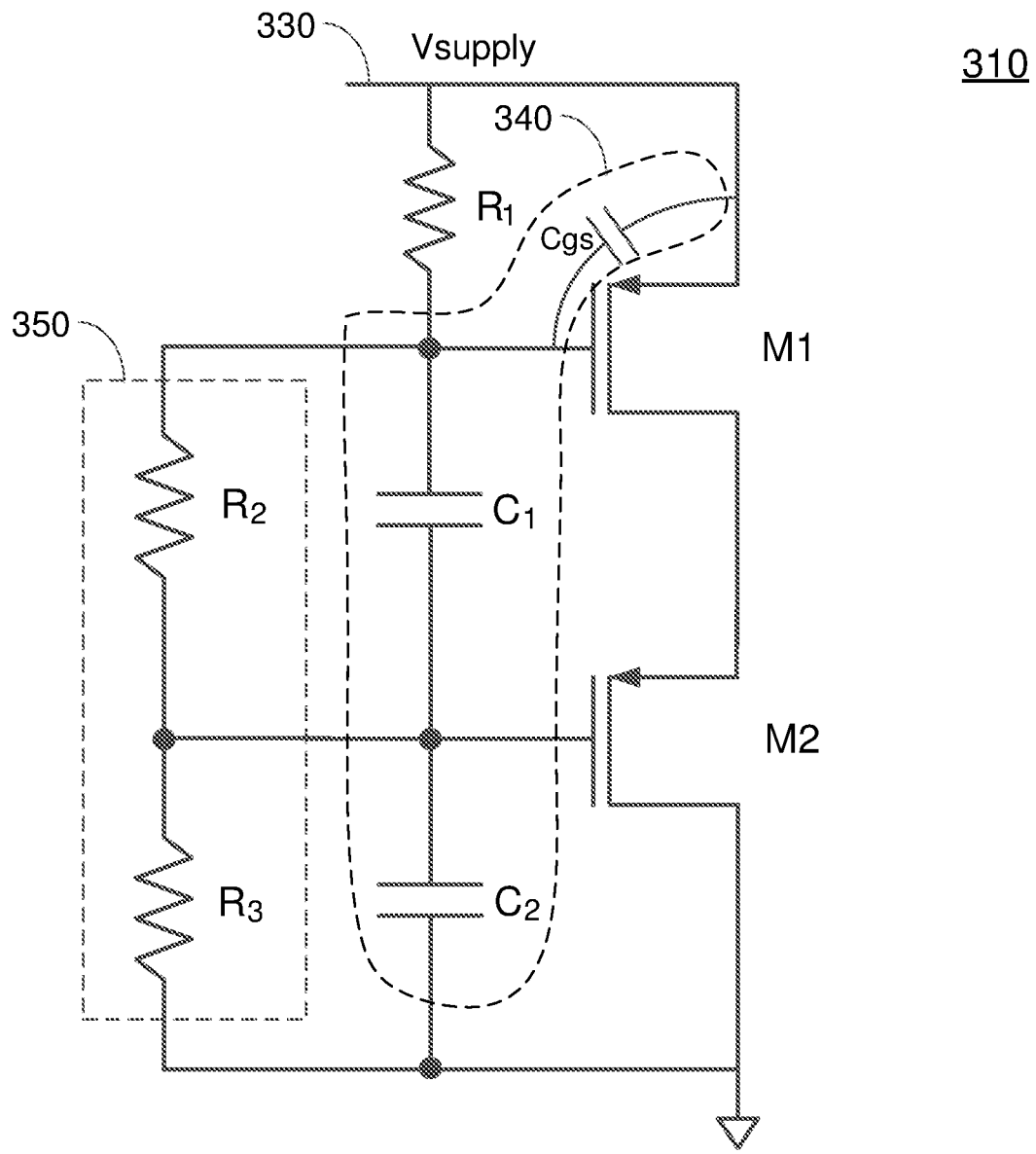
FIG. 3 shows an example of a high voltage clamp including stacked transistors according to certain aspects of the present disclosure.

FIG. 3 shows an example of a high voltage clamp 310 including stacked transistors according to certain aspects of the present disclosure. The high voltage clamp 310 may be used to implement the high voltage clamp 130 shown in FIG. 1. The stacked transistors include a first transistor M1 and a second transistor M2, where each of the transistors M1 and M2 is a p-type transistor and each of the transistors M1 and M2 may be implemented with a LDMOS transistor. The first and second transistors M1 and M2 are coupled in series between a power bus 330 (e.g., power bus 115) and ground, in which the source of the first transistor M1 is coupled to power bus 330, the drain of the first transistor M1 is coupled to the source of the second transistor M2, and the drain of the second transistor M2 is coupled to ground. As a result, when the first and second transistors M1 and M2 are turned on, the first and second transistors M1 and M2 provide a low-impedance path from the power bus 330 to ground through the first and second transistors M.

The high voltage clamp 310 also includes a first resistor $R_1$ coupled between the source and the gate of the first transistor M1. The first resistor $R_1$ is used to keep the first transistor M1 turned off during normal operating conditions when a DC supply voltage is present on the power bus 330, as discussed further below.

The high voltage clamp 310 also includes a resistive voltage divider 350 including a second resistor $R_2$ and a third resistor $R_3$ coupled in series. The second resistor $R_2$ is coupled between the gate of the first transistor M1 and the gate of the second transistor M2, and the third resistor $R_3$ is coupled between the gate of the second transistor M2 and ground. The resistive voltage divider 350 is used to provide DC biasing for the high voltage clamp 310, as discussed further below.

The high voltage clamp 310 also includes a first capacitor $C_1$ and a second capacitor $C_2$ coupled in series. The first capacitor $C_1$ is coupled between the gate of the first transistor M1 and the gate of the second transistor M2, and the second capacitor $C_2$ is coupled between the gate of the second transistor M2 and ground. The first and second capacitors $C_1$ and $C_2$ and the gate-to-source capacitance Cgs of the first transistor M1 form a capacitive voltage divider 340. The capacitive voltage divider 340 is used to trigger the high voltage clamp 310 when a high voltage transient is present on the power bus 330, as discussed further below. In FIG. 3, the gate-to-source capacitance Cgs of the first transistor M1 is depicted as a capacitor coupled between the source and gate of the first transistor M1 for illustrative purposes. However, it is to be appreciated that the gate-to-source capacitance Cgs comes from the structure of the first transistor M1.

During normal operation, a supply voltage (labeled "Vsupply") is present on the power bus 330, in which the supply voltage is a DC voltage (e.g., used to power the circuit 120). Thus, during normal operation, the high voltage clamp 310 operates under DC voltage conditions. Under DC voltage conditions, the first resistor $R_1$ between the source and the gate of the first transistor M1 causes the gate-to-source voltage of the first transistor M1 to be approximately zero volts. This assumes that the resistance of the first resistor $R_1$ is much lower than the resistances of the second resistor $R_2$ and the third resistor $R_3$ in the resistive voltage divider 350 so that the voltage drop across the first resistor $R_1$ is close to zero volts. For example, the first resistor $R_1$ may have a resistance of approximately 1 KΩ and each of the second and third resistors $R_2$ and $R_3$ may have a resistance of approximately 500 KΩ. It is to be appreciated that the above resistance values are exemplary and that the resistors may have different resistance values.

Thus, under normal DC voltage conditions, the first resistor $R_1$ keeps the first transistor M1 turned off. Since the first transistor M1 is turned off, the first transistor M1 has a high impedance, and therefore does not affect the supply voltage on the power bus 330.

The resistive voltage divider 350 provides DC biasing for the gates of the first and second transistors M1 and M2 based on the supply voltage. The DC bias voltage at the gate of the first transistor M1 is approximately equal to the supply voltage, assuming the voltage drop across the first resistor $R_1$ is small. The resistive voltage divider 350 also biases the gate of the second transistor M2 at a DC bias voltage approximately equal to the following:

$$Vg2 = \frac{R_3}{R_2 + R_3} \cdot Vsupply \quad (1)$$

where Vg2 is the DC bias voltage at the gate of the second transistor M2, $R_2$ in the equation is the resistance of the second resistor $R_2$, $R_3$ in the equation is the resistance of the third resistor $R_3$, and Vsupply is the supply voltage.

In one example, the second resistor $R_2$ and the third resistor $R_3$ have approximately the same resistance so that the DC bias voltage at the gate of the second transistor M2 is approximately equal to half the supply voltage. Thus, in this example, the DC bias voltage at the gate of the of the first transistor M1 is approximately equal to the supply voltage, and the DC bias voltage at the gate of the of the second transistor M2 is approximately equal to half the supply voltage.

Because the first transistor M1 is turned off during under normal DC voltage conditions, approximately no current flows through the second transistor M2 (which is coupled in series with the first transistor M1). As a result, the second transistor M2 is turned off, and the source-to-gate voltage of the second transistor M2 is below the threshold voltage of the second transistor M2. Assuming the source-to-gate voltage of the second transistor M2 is close to zero volts, the DC voltage at the source of the second transistor M2 is approximately equal to the DC bias voltage at the gate of the second transistor M2. For the example in which the resistive voltage divider 350 biases the gate of the second transistor M2 at approximately half the supply voltage, the DC voltage at the source of the second transistor M2 is approximately equal to half the supply voltage. As a result, the magnitude of the drain-to-source voltage of the first transistor M1 is approximately equal to half the supply voltage, and the magnitude of the drain-to-source voltage of the second transistor M2 is approximately equal to half the supply voltage.

Thus, in this example, the resistive voltage divider 350 causes the supply voltage to be approximately evenly split between the first transistor M1 and the second transistor M2. By splitting the supply voltage between the first transistor M1 and the second transistor M2, the amount of voltage stress on each transistor is reduced, which reduces degradation of the first and second transistors M1 and M2 due to voltage stress. Also, since both the first and second transistors M1 and M2 are turned off, the magnitude of the gate-to-source voltage of each transistor is close to zero volts.

The resistive voltage divider 350 also DC biases the first capacitor $C_1$ and the second capacitor $C_2$. For the example in which the second resistor $R_2$ and the third resistor $R_3$ have approximately the same resistance, the resistive voltage divider 350 approximately evenly splits the supply voltage between the first capacitor $C_1$ and the second capacitor $C_2$. Thus, in this example, the DC voltage across each capacitor is approximately half the supply voltage.

When a high voltage transient is present on the power bus 330, the capacitive voltage divider 340 divides the high voltage transient into a transient voltage between the source and the gate of the first transistor M1, a transient voltage between the gates of the first and second transistors M1 and M2, and a transient voltage between the gate of the second transistor M2 and ground. This assumes that the resistors $R_1$, $R_2$ and $R_3$ do not respond to the high voltage transient (i.e., the duration of the high voltage transient is shorter than the RC time constants associated with the resistors). When the transient voltage between the source and the gate of the first transistors M1 reaches the threshold voltage of the first transistor M1, the first transistor M1 turns on, which, in turn, causes the second transistor M2 to turn on. As a result, the first and second transistors M1 and M2 provide a low-impedance path from the power bus 330 to ground through the first and second transistors M1 and M2. The low-impedance path shunts the energy of the high voltage transient to ground, thereby suppressing the high voltage transient.

The high voltage clamp 310 is triggered (i.e., the first and second transistors M1 and M2 turn on) when the high voltage transient exceeds a trigger voltage threshold. The trigger voltage threshold is a function of the gate-to-source capacitance Cgs of the first transistor M1 and the combined capacitance of the first and second capacitors $C_1$ and $C_2$. The combined capacitance of the first and second capacitors $C_1$ and $C_2$ is given by:

$$Cc = \frac{C_1 \cdot C_1}{C_1 + C_2} \quad (2)$$

where Cc is the combined capacitance, $C_1$ in the equation is the capacitance of the first capacitor $C_1$, and $C_2$ in the equation is the capacitance of the second capacitance $C_2$. The trigger voltage threshold of the high voltage clamp 310 may be set to a desired voltage by sizing the capacitances of the first and second capacitors $C_1$, and $C_2$ according to the desired voltage for the trigger voltage threshold. Thus, the capacitive voltage divider 340 triggers the high voltage clamp 310 when a high voltage transient on the power bus 330 exceeds the trigger voltage threshold set by the capacitive voltage divider 340.

In the above example, the high voltage clamp 310 is used to suppress a high voltage transient when the supply voltage is present on the power bus 330. The high voltage clamp 310 may also be used to provide ESD protection when there is no supply voltage on the power bus 330. In this case, the internal nodes of the high voltage clamp 310 are initially power collapsed since the supply voltage is not present. When an ESD event occurs, the capacitive voltage divider 340 divides the high voltage transient of the ESD event into a transient voltage between the source and the gate of the first transistor M1, a transient voltage between the gates of the first and second transistors M1 and M2, and a transient voltage between the gate of the second transistor M2 and ground. When the transient voltage between the source and the gate of the first transistor M1 reaches the threshold voltage of the first transistor M1, the first transistor M1 turns on, which, in turn, causes the second transistor M2 to turn on. As a result, the first and second transistors M1 and M2 provide a low-impedance path from the power bus 330 to ground. The low-impedance path shunts the energy of the ESD to ground, thereby protecting circuits coupled to the power bus 330 from the ESD event. Thus, the high voltage clamp 310 is capable of providing dual protection against high voltage spikes on the supply voltage and ESD events.

In certain cases, the supply voltage may be present on the power bus 330, but not being used to power the circuit 120. This may occur, for example, when the circuit 120 enters a sleep mode to conserve power. In the sleep mode, the circuit 120 may be decoupled from the power bus 330 by a power switch (not shown) between the power bus 330 and the circuit 120. In this case, the leakage current of the resistive voltage divider 350 consumes power even though the high voltage clamp 310 is not needed by the circuit 120. Accordingly, it is desirable to stop the leakage current of the resistive voltage divider 350 when the high voltage clamp 310 is not needed by the circuit 120.

Figure 4:
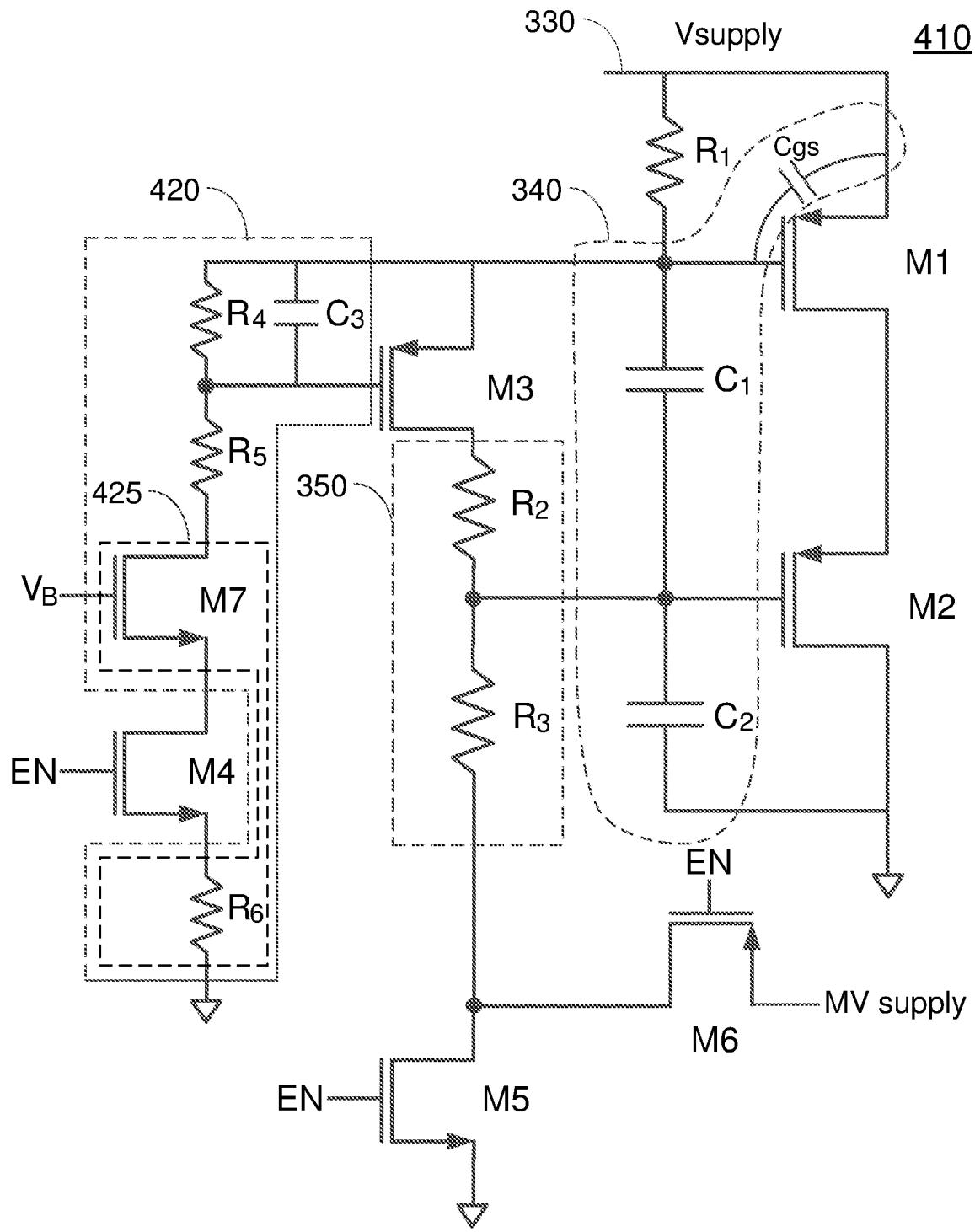
FIG. 4 shows an example of a high voltage clamp including stacked transistors and circuitry for placing the high voltage clamp in an active mode or a non-active mode according to certain aspects of the present disclosure.

FIG. 4 shows an example of a high voltage clamp 410 according to certain aspects of the present disclosure. The high voltage clamp 410 is configured to operate in an active mode or a non-active mode. The high voltage clamp 410 can be placed in the active mode to suppress high voltage spikes on the supply voltage when the circuit 120 is active, and the high voltage clamp 410 can be placed in the non-active mode when the circuit 120 is in the sleep mode. In the non-active mode, the current path of the resistive voltage divider 350 is disabled to significantly reduce the leakage current of the resistive voltage divider 350 to conserve power, as discussed further below.

The high voltage clamp 410 includes the first resistor $R_1$, the first transistor M1, the second transistor M2, the capacitive voltage divider 340 and the resistive voltage divider 350 discussed above. The high voltage clamp 410 also includes a third transistor M3 coupled between the gate of the first transistor M1 and the resistive voltage divider 350. As discussed further below, the third transistor M3 is used to disable the current path of the resistive voltage divider 350 in the non-active mode. The high voltage clamp 410 also includes a bias circuit 420 for setting the source-to-gate voltage of the third transistor M3 in the active mode, as discussed further below. In the example shown in FIG. 4, the third transistor M3 is a p-type transistor.

The high voltage clamp 410 also includes a fourth transistor M4, a fifth transistor M5 and a sixth transistor M6 used to place the high voltage clamp 410 in the active mode or the non-active mode according to the logic value of an enable signal (labeled "EN"), as discussed further below. The fourth transistor M4 is configured to enable the bias circuit 420 when the high voltage clamp 410 is in the active mode and disable the bias circuit 420 when the high voltage clamp 410 is in the non-active mode. The fifth transistor M5 is coupled between the resistive voltage divider 350 and ground. The fifth transistor M5 is configured to couple the resistive voltage divider 350 to ground when the high voltage clamp 410 is in the active mode and decouple the resistive voltage divider 350 from ground when the high voltage clamp 410 is in the non-active mode. The sixth transistor M6 is coupled between the third resistor $R_3$ and a bias voltage MV supply. The sixth transistor M6 is configured to couple the bias voltage MV supply to the gate of the second transistor M2 through the third resistor $R_3$ in the non-active mode and decouple the bias voltage MV supply from the third resistor $R_3$ in the active mode.

In the example shown in FIG. 4, the fourth and fifth transistors M4 and M5 are implemented with n-type transistors, and the sixth transistor M6 is implemented with a p-type transistor. The gate of each of the fourth, fifth and sixth transistors M4, M5 and M6 receives the enable signal EN, which controls the mode of the high voltage clamp 410. In the example shown in FIG. 4, the enable signal EN is set high (i.e., logic one) to place the high voltage clamp 410 in the active mode, and set low (i.e., logic zero) to place the high voltage clamp 410 in the non-active mode.

When the enable signal EN is set high to place the high voltage clamp 410 in the active mode, the fourth and fifth transistors M4 and M5 are turned on, and the sixth transistor M6 is turned off. This causes the fourth transistor M4 to enable the bias circuit 420, the fifth transistor M5 to couple the resistive voltage divider 350 to ground, and the sixth transistor M6 to decouple the bias voltage MV supply from the third resistor $R_3$.

Figure 5:
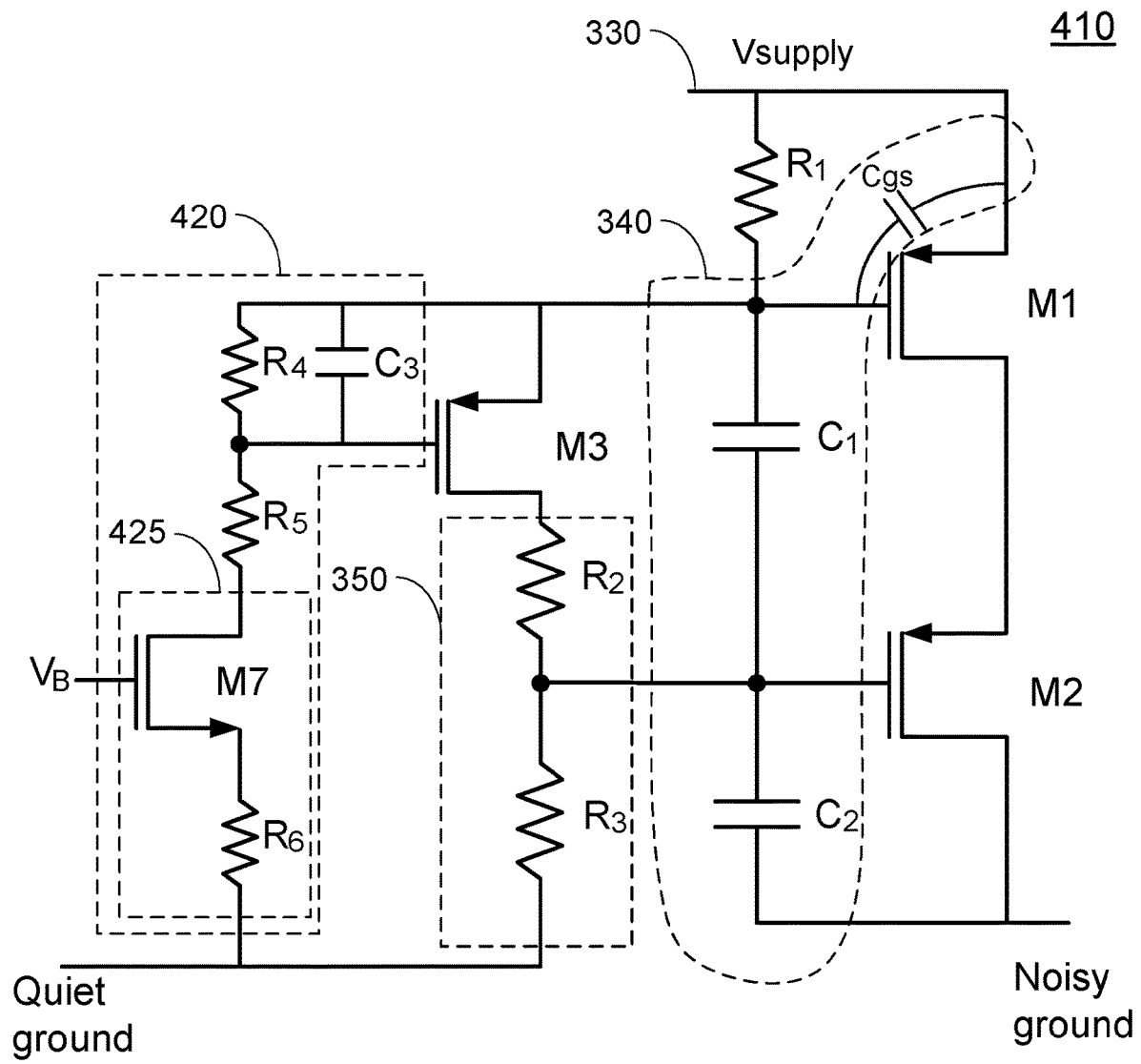
FIG. 5 shows an equivalent circuit of the high voltage clamp shown in FIG. 4 when the high voltage clamp is in the active mode according to certain aspects of the present disclosure.

FIG. 5 shows an equivalent circuit of the high voltage clamp 410 in the active mode. In the active mode, the bias circuit 420 turns on the third transistor M3, coupling the resistive voltage divider 350 to the gate of the first transistor M1. In this regard, the bias circuit 420 sets the source-togate voltage of the third transistor M3 to a voltage that is high enough to turn on the third transistor M3, but not too high that the voltage would damage the third transistor M3 (e.g., cause gate oxide breakdown in the third transistor M3). If the third transistor M3 were simply pulled to ground to turn on the third transistor M3 instead of using bias circuit 420, then the entire supply voltage would appear across the source to gate of the third transistor M3, which may exceed the source-to-gate voltage limit of the third transistor M3.

Since the third transistor M3 is turned on, the resistive voltage divider 350 is coupled to the gate of the first transistor M1. In this case, the resistive voltage divider 350 operates in a similar manner as in high voltage clamp 310 shown in FIG. 3. The resistive voltage divider 350 divides the supply voltage on the power bus 330 to provide DC biasing for the gates of the first transistor M1 and the second transistor M2. For the example in which the second and third resistors $R_2$ and $R_3$ have approximately the same resistance, the resistive voltage divider 350 biases the gate of the first transistor M1 at approximately the supply voltage and biases the gate of the second transistor M2 at approximately half the supply voltage. As discussed above, this splits the supply voltage approximately evenly between the first and second transistors M1 and M2, which reduces the amount of voltage stress on each transistor.

The capacitive voltage divider 340 operates in a similar manner as in high voltage clamp 310 shown in FIG. 3. The capacitive voltage divider 340 triggers the high voltage clamp 410 in response to a high voltage transient on the power bus 330 that exceeds the trigger voltage threshold by set the capacitive voltage divider 340. When the high voltage clamp is triggered, the first and second transistors M1 and M2 turn on to provide a low-impedance path from the power bus 330 to ground. The low-impedance path shuts the energy of the high voltage transient to ground, thereby suppressing the high voltage transient on the power bus 330. Thus, the high voltage clamp 410 preserves the functionality of the high voltage clamp 310 in the active mode.

In the example shown in FIG. 5, the bias circuit 420 includes a fourth resistor $R_4$, a third capacitor $C_3$, a fifth resistor $R_5$, and a current source 425. The fourth resistor $R_4$ and the third capacitor $C_3$ are coupled in parallel between the source and the gate of the third transistor M3. The fifth resistor $R_5$ is coupled between the fourth resistor $R_4$ and the current source 425.

In operation, the current source 425 generates a current that flows through the fourth resistor $R_4$ generating a voltage drop across the fourth resistor $R_4$ given by:

$$Vd = I \cdot R_4 \quad (3)$$

where Vd is the voltage drop across the fourth resistor $R_4$, I is the current of the current source 425, and $R_4$ in the equation is the resistance of the fourth resistor $R_4$. As shown in equation (3), the voltage drop is a function of the resistance of the fourth resistor $R_4$ and the current of the current source 425.

The source-to-gate voltage of the third transistor M3 is approximately equal to the voltage drop across the fourth resistor $R_4$ since the fourth resistor $R_4$ is coupled between the source and the gate of the third transistor M3. Since the voltage drop is a function of the resistance of the fourth resistor $R_4$ and the current of the current source 425, the source-to-gate voltage of the third transistor M3 can be set to a desired DC voltage by sizing the resistance of the fourth resistor $R_4$ and/or the current of the current source 425 according to the desired DC voltage. The source-to-gate voltage of the third transistor M3 may be set to a DC voltage that is between the threshold voltage of the third transistor M3 and the gate-to-source voltage limit of the third transistor M3. This helps ensure that the DC voltage is high enough to turn on the third transistor M3, but not too high that the voltage would damage the third transistor M3.

In the example shown in FIG. 5, the current source 425 includes a seventh transistor M7 and a sixth resistor $R_6$, where the seventh transistor M7 is an n-type transistor. The drain of the seventh transistor M7 is coupled to the fifth resistor $R_5$, and the sixth resistor $R_6$ is coupled between the source of the seventh transistor M7 and ground. The gate of the seventh transistor M7 is biased by a bias voltage $V_B$. For the example in which the power source 112 includes a battery, the bias voltage $V_B$ may be the battery voltage. In this example, the current of the current source 425 is given by:

$$I = \frac{V_B - V_T}{R_6} \quad (4)$$

where I is the current of the current source 425, $V_B$ is the bias voltage applied to the gate of the seventh transistor M7, $V_T$ is the threshold voltage of the seventh transistor M7, and $R_6$ in the equation is the resistance of the sixth resistor $R_6$. In this example, the voltage drop across the fourth resistor $R_4$ is given by:

$$Vd = I \cdot R_4 = \frac{(V_B - V_T)}{R_6} \cdot R_4 \quad (5)$$

As shown in equation (5), the voltage drop across the fourth resistor R4 (and hence the source-to-gate voltage of the third transistor M3) is a function of resistance of the fourth resistor $R_4$ and the resistance of the sixth resistor $R_6$. Thus, in this example, the source-to-gate voltage of the third transistor M3 can be set to a desired DC voltage by sizing the resistance of the fourth resistor $R_4$ and/or the resistance of the sixth resistor $R_6$ according to the desired DC voltage.

The third capacitor $C_3$ is coupled between the source and the gate of the third transistor M3. Thus, the voltage across the third capacitor $C_3$ is approximately equal to the source-to-gate voltage of the third transistor M3 set by the bias circuit 420. The third capacitor $C_3$ is used to maintain the source-to-gate voltage of the third transistor M3 when there is a high voltage transient on the supply voltage to keep the third transistor M3 on.

The fifth resistor $R_5$ between the third capacitor $C_3$ and the drain of the seventh transistor M7 is used to isolate the third capacitor $C_3$ from a parasitic capacitance at the drain of the seventh transistor M7. Without the fifth resistor $R_5$, the third capacitor $C_3$ and the parasitic capacitance at the drain of the seventh transistor M7 would form a capacitance voltage divider. The capacitive voltage divider would cause the source-to-gate voltage of the third transistor M3 to change in response to a high voltage transient on the supply voltage, which runs contrary to the purpose of the third capacitor $C_3$, which is to maintain the source-to-gate voltage of the third transistor M3 during a transient. Thus, the fifth resistor $R_5$ is used to prevent the third capacitor $C_3$ and the parasitic capacitance at the drain of the seventh transistor M7 from forming a capacitive voltage divider.

Referring back to FIG. 4, the fourth transistor M4 is configured to enable the bias circuit 420 when the high voltage clamp 410 is in the active mode and disable the bias circuit 420 when the high voltage clamp 410 is in the non-active mode. In this example, the fourth transistor M4 is coupled between the seventh transistor M7 and the sixth resistor $R_6$. More particularly, the drain of the fourth transistor M4 is coupled to the source of the seventh transistor M7 and the source of the fourth transistor M4 is coupled to the sixth resistor $R_6$.

When the enable signal EN is set high to place the high voltage clamp 410 in the active mode, the fourth transistor M4 is turned on. As a result, the fourth transistor M4 couples the source of the seventh transistor M7 to the sixth resistor $R_6$, thereby enabling the bias circuit 420. When the enable EN is set low to place the high voltage clamp 410 in the non-active mode, the fourth transistor M4 is turned off. As a result, the fourth transistor M4 decouples the source of the seventh transistor M7 from the sixth resistor $R_6$, thereby disabling the bias circuit 420.

When the enable signal EN is set low to place the high voltage clamp 410 in the non-active mode, the fourth and fifth transistors M4 and M5 are turned off, and the sixth transistor M6 is turned on. Turning off the fourth transistor M4 causes the fourth transistor M4 to disable the bias circuit 420. Since the bias circuit 420 is disabled, the bias circuit 420 does not turn on the third transistor M3. As a result, the resistive voltage divider 350 is decoupled from the power bus 330. This disables the current path from the power bus 330 to ground through the resistive voltage divider 350, thereby preventing static leakage current through the resistive voltage divider 350.

Turning off the fifth transistor M5 causes the fifth transistor M5 to decouple the third resistor $R_3$ of the resistive voltage divider 350 from ground. This allows the gate of the second transistor M2 to be DC biased by the bias voltage MV supply, as discussed further below.

Turning on the sixth transistor M6 causes the sixth transistor M6 to couple the bias voltage MV supply to the gate of the second transistor M2 through the third resistor $R_3$. Thus, in the non-active mode, the DC voltage on the gate of the second transistor M2 is set by the bias voltage MV supply.

Figure 6:
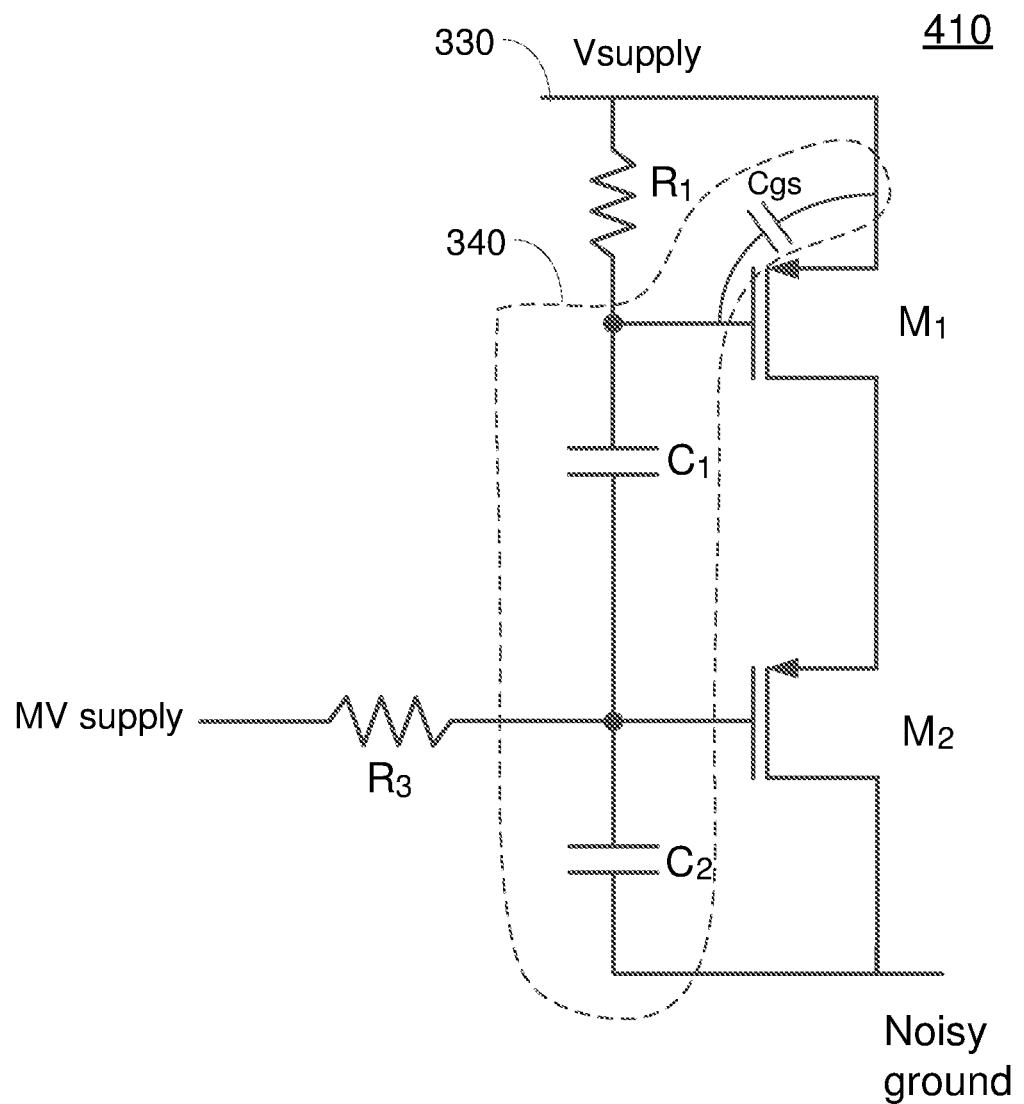
FIG. 6 shows an equivalent circuit of the high voltage clamp shown in FIG. 4 when the high voltage clamp is in the non-active mode according to certain aspects of the present disclosure.

FIG. 6 shows an equivalent circuit of the high voltage clamp 410 in the non-active mode. In this mode, the current leakage path from the power bus 330 to ground through the resistive voltage divider 350 is disabled. Also, the gate and source voltage of the second transistor M2 are set approximately to the bias voltage MV supply. Setting the gate and source voltage of the second transistor M2 to approximately the bias voltage MV supply splits the supply voltage between the first and second transistors M1 and M2, reducing the voltage stress on each transistor.

For the example in which the power source 112 includes a battery, the bias voltage MV supply may be the battery voltage. In this case, the power device 110 may upconvert the battery voltage to generate the supply voltage so that the supply voltage is higher than the battery voltage. In another example, the bias voltage MV supply may be approximately equal to the midpoint of the supply voltage (i.e., half the supply voltage).

FIG. 7 is a flow chart illustrating a circuit protection method 700 according to certain aspects of the present disclosure. The method 700 may be performed by the high voltage clamp 410.

At block 710, a gate of a first transistor and a gate of a second transistor are biased based on a supply voltage on a power bus, wherein the first transistor and the second transistor are coupled in series between the power bus and a ground. For example, the gate of the second transistor (e.g., transistor M2) may be biased by dividing the supply voltage using a resistive voltage divider (e.g., resistive voltage divider 350) to generate a bias voltage and applying the bias voltage to the gate of the second transistor. In this example, the bias voltage may be approximately equal to half the supply voltage.

At block 720, the first and second transistors are turned on in response to a voltage transient on the power bus exceeding a trigger threshold voltage. For example, the first and second transistors may be turned on using a capacitive voltage divider (e.g., capacitive voltage divider 340) coupled between the power bus (e.g., power bus 330) and the ground, wherein the trigger threshold voltage is set by the capacitive voltage divider.

As used herein, the term "drain-to-source voltage limit" may refer to a magnitude of a maximum drain-to-source voltage that a transistor can tolerate. Also, the term "gate-to-source limit" may refer to a magnitude of a maximum gate-to-source voltage that a transistor can tolerate.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. Within the present disclosure, the term "approximately" means within 10 percent of the stated value.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A clamp, comprising:
   first and second transistors coupled in series between a power bus and a ground;
   a resistive voltage divider configured to bias a gate of the first transistor and a gate of the second transistor based on a supply voltage on the power bus; and
   a capacitive voltage divider including a first capacitor coupled between the gate of the first transistor and the gate of the second transistor, and a second capacitor coupled between the gate of the second transistor and the ground, wherein the capacitive voltage divider is configured to turn on the first and second transistors in response to a voltage transient on the power bus exceeding a trigger threshold voltage,
   wherein the clamp is coupled between the power bus and the ground, in parallel with a circuit that is supplied with power by the power bus.

2. The clamp of claim 1, further comprising a first resistor coupled between a source and the gate of the first transistor.

3. The clamp of claim 1, wherein the first capacitor and the second capacitor have approximately a same capacitance.

4. The clamp of claim 1, wherein each of the first and second transistors comprises a p-type laterally diffused metal oxide semiconductor (LDMOS) transistor.

5. The clamp of claim 1, wherein when the capacitive voltage divider turns on the first and second transistors in response to a voltage transient on the power bus, the first and second transistors shunt current from the power bus to the ground through the first and second transistors.

6. The clamp of claim 1, further comprising a first resistor coupled between the power bus and the gate of the first transistor, wherein the first resistor is configured to turn off the first transistor when the supply voltage is present on the power bus.

7. The clamp of claim 1, wherein a source of the first transistor is coupled to the power bus, and the resistive voltage divider is configured to bias the gate of the first transistor at a voltage approximately equal to the supply voltage on the power bus.

8. The clamp of claim 2, wherein the resistive voltage divider comprises:
a second resistor coupled between the gate of the first transistor and the gate of the second transistor; and
a third resistor coupled between the gate of the second transistor and the ground.

9. The clamp of claim 3, wherein the capacitive voltage divider includes a gate-to-source capacitance of the first transistor.

10. The clamp of claim 6, wherein the supply voltage is provided by a power source coupled to the power bus.

11. The clamp of claim 6, wherein the supply voltage is a direct current (DC) voltage.

12. The clamp of claim 6, wherein the resistive voltage divider comprises:
a second resistor coupled between the gate of the first transistor and the gate of the second transistor; and
a third resistor coupled between the gate of the second transistor and the ground.

13. The clamp of claim 7, wherein the supply voltage is provided by a power source coupled to the power bus.

14. The clamp of claim 7, wherein the supply voltage is a direct current (DC) voltage.

15. The clamp of claim 7, further comprising a first resistor coupled between a source and the gate of the first transistor.

16. The clamp of claim 8, wherein the second resistor and the third resistor have approximately a same resistance.

17. The clamp of claim 15, wherein the resistive voltage divider comprises:
a second resistor coupled between the gate of the first transistor and the gate of the second transistor; and
a third resistor coupled between the gate of the second transistor and the ground.

18. A clamp comprising:
first and second transistors coupled in series between a power bus and a ground;
a resistive voltage divider configured to bias a gate of the first transistor and a gate of the second transistor based on a supply voltage on the power bus;
a capacitive voltage divider configured to turn on the first and second transistors in response to a voltage transient on the power bus exceeding a trigger threshold voltage;
a third transistor coupled between the gate of the first transistor and the resistive voltage divider; and
a bias circuit,
wherein the clamp is coupled between the power bus and the ground, in parallel with a circuit that is supplied with power by the power bus, and
wherein the bias circuit is configured to turn on the third transistor when the circuit that is supplied with power by the power bus is active and turn off the third transistor when the circuit that is supplied with power by the power bus is in a sleep mode.

19. The clamp of claim 18, wherein the resistive voltage divider comprises:
a first resistor coupled between the third transistor and the gate of the second transistor; and
a second resistor coupled between the gate of the second transistor and the ground.

20. The clamp of claim 18, wherein the bias circuit is configured to set a source-to-gate voltage of the third transistor.

21. The clamp of claim 18, wherein the bias circuit comprises:
a first resistor coupled between a source and a gate of the third transistor; and
a current source configured to generate a current that flows through the first resistor.

22. The clamp of claim 18, further comprising:
a fourth transistor coupled between the resistive voltage divider and the ground; and
a fifth transistor coupled between the resistive voltage divider and a bias voltage;
wherein the fourth transistor is configured to turn on when the circuit that is supplied with power by the power bus is active and turn off when the circuit that is supplied with power by the power bus is in the sleep mode; and
the fifth transistor is configured to turn off when the circuit that is supplied with power by the power bus is active and turn on when the circuit that is supplied with power by the power bus is in the sleep mode.

23. The clamp of claim 20, wherein the bias circuit comprises a capacitor coupled between a source and a gate of the third transistor.

24. The clamp of claim 21, wherein the bias circuit further comprises a capacitor coupled between the source and the gate of the third transistor.

25. The clamp of claim 22, wherein the resistive voltage divider comprises:
a first resistor coupled between the third transistor and the gate of the second transistor; and
a second resistor coupled between the gate of the second transistor and the fourth transistor.

26. The clamp of claim 24, wherein the bias circuit further comprises a second resistor coupled between the first resistor and the current source.

27. A circuit protection method, comprising:
biasing a gate of a first transistor and a gate of a second transistor based on a supply voltage on a power bus, wherein the first transistor and the second transistor are coupled in series between the power bus and a ground; and
turning on the first and second transistors using a capacitive voltage divider in response to a voltage transient on the power bus exceeding a trigger threshold voltage, thereby shunting energy from the voltage transient to the ground, wherein the capacitive voltage divider comprises a first capacitor coupled between the gate of the first transistor and the gate of the second transistor, and a second capacitor coupled between the gate of the second transistor and the ground.

28. The method of claim 27, wherein biasing the gate of the first transistor and the gate of the second transistor comprises:
dividing the supply voltage using a resistive voltage divider to generate a bias voltage; and
applying the bias voltage to the gate of the second transistor.

29. The method of claim 27, wherein the capacitive voltage divider is coupled between the power bus and the ground, and the trigger threshold voltage is set by the capacitive voltage divider.

30. The method of claim 27, wherein the capacitive voltage divider includes a gate-to-source capacitance of the first transistor.

31. The method of claim 28, wherein the bias voltage is approximately equal to half the supply voltage.

32. The method of claim 28, further comprising:
coupling the resistive voltage divider to the power bus in an active mode; and
decoupling the resistive voltage divider from the power bus in a non-active mode.

33. The method of claim 29, wherein biasing the gate of the first transistor and the gate of the second transistor comprises:
dividing the supply voltage using a resistive voltage divider to generate a bias voltage; and
applying the bias voltage to the gate of the second transistor.

34. The method of claim 33, further comprising:
coupling the resistive voltage divider to the power bus in an active mode; and
decoupling the resistive voltage divider from the power bus in a non-active mode.

35. An apparatus for circuit protection, comprising:
first and second transistors coupled in series between a power bus and a ground;
means for biasing a gate of the first transistor and a gate of the second transistor based on a supply voltage on the power bus; and
means for turning on the first and second transistors in response to a voltage transient on the power bus exceeding a trigger threshold voltage including a means for capacitive voltage dividing coupled between the power bus and the ground, the means for capacitive voltage dividing comprising a first capacitor coupled between the gate of the first transistor and the gate of the second transistor, and a second capacitor coupled between the gate of the second transistor and the ground,
wherein the apparatus is coupled between the power bus and the ground, in parallel with a circuit that is supplied with power by the power bus.

* * * * *